(12) United States Patent
Liu

(10) Patent No.: US 8,253,579 B2
(45) Date of Patent: Aug. 28, 2012

(54) PORTABLE SYSTEM AND POWER ADAPTER THEREOF

(75) Inventor: Hsin-Yen Liu, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 312 days.

(21) Appl. No.: 12/789,298

(22) Filed: May 27, 2010

(65) Prior Publication Data
US 2011/0267199 A1    Nov. 3, 2011

(30) Foreign Application Priority Data
Apr. 30, 2010    (TW) ............................... 99113776 A

(51) Int. Cl.
G08B 21/00    (2006.01)
(52) U.S. Cl. .................. 340/636.1; 340/636.2; 340/538; 340/540; 340/541; 340/10.4; 340/13.27; 320/114; 320/132; 320/137; 320/148
(58) Field of Classification Search ............... 340/636.1, 340/636.2, 538, 540, 541, 10.4, 13.27; 320/114, 320/132, 137, 148
See application file for complete search history.

(56) References Cited

U.S. PATENT DOCUMENTS
| | | | | |
|---|---|---|---|---|
| 8,188,854 B2 * | 5/2012 | Yamashita | ................. | 340/538 |
| 2008/0297116 A1* | 12/2008 | Odaohhara et al. | ........... | 320/137 |
| 2011/0181401 A1* | 7/2011 | Walley et al. | ............. | 340/13.23 |

* cited by examiner

Primary Examiner — Tai T Nguyen
(74) Attorney, Agent, or Firm — Altis Law Group, Inc.

(57) ABSTRACT

A portable system includes a portable device and a power adapter to supply power to the portable device. The portable device includes a rechargeable battery and a measurement chip to measure charge remaining in the rechargeable battery. The power adapter includes a transmission line, a microprocessor, and a display unit. The microprocessor receives the readout of the amount of charge remaining in the rechargeable battery from the measurement chip via the transmission line, and generates a display signal according to the charge remaining. The display unit displays the charging progress of the rechargeable battery according to the display signal received from the microprocessor.

8 Claims, 4 Drawing Sheets

PORTABLE SYSTEM AND POWER ADAPTER THEREOF

BACKGROUND

1. Technical Field

The present disclosure relates to portable systems, and particularly to a portable system with a power adapter.

2. Description of Related Art

Nowadays, most portable devices, such as notebook computers, mobile phones, cameras, and personal digital assistants, display the percentage or level of voltage or charge remaining on the rechargeable batteries. However, for some portable electronic devices, when the rechargeable battery is being charged, and the portable device is not powered on, the level of charge may not be displayed. Therefore, the charging progress of the rechargeable battery cannot be known, which is inconvenient.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several view.

DETAILED DESCRIPTION

The disclosure, including the accompanying drawings in which like references indicate similar elements is illustrated by way of example and not by way of limitation. It should be noted that references to "an" or "one" embodiment in this disclosure are not necessarily to the same embodiment, and such references mean at least one.

Figure 1:
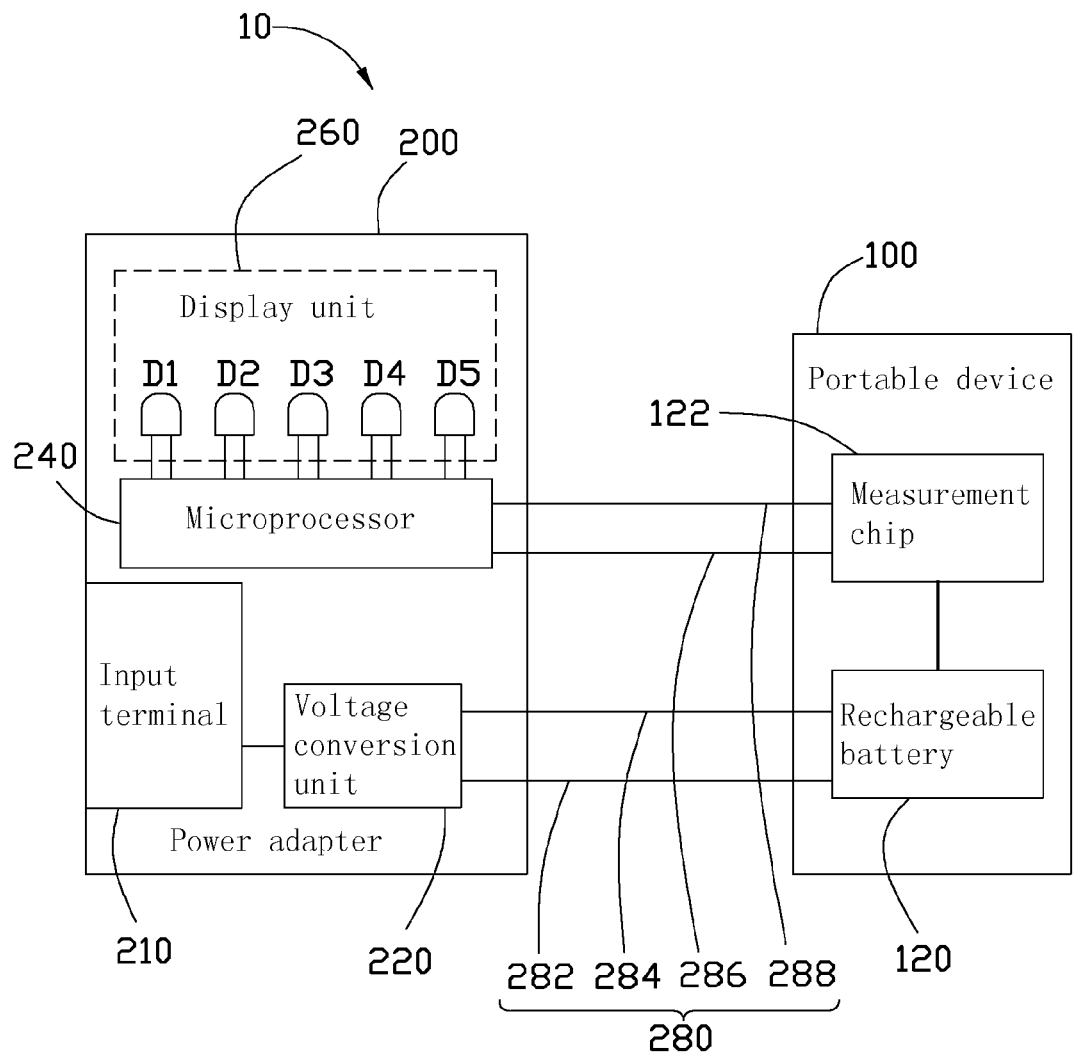
FIG. 1 is a schematic diagram of a first exemplary embodiment of a portable system.
Figure 2:
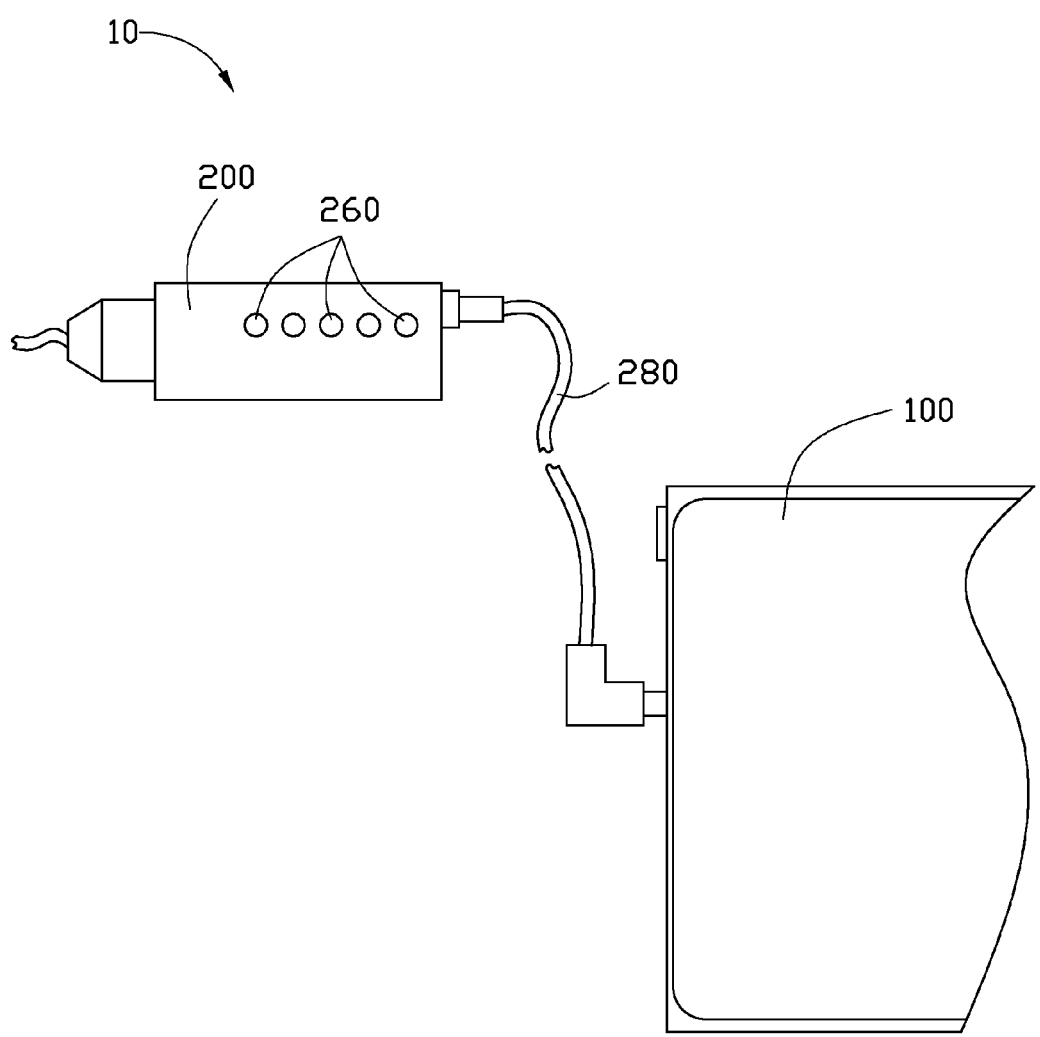
FIG. 2 is another schematic diagram of the portable system of FIG. 1.

Referring to FIGS. 1 and 2, a first exemplary embodiment of a portable system 10 includes a portable device 100, and a power adapter 200 to supply power for the portable device 100. The portable device 100 includes a rechargeable battery 120, and a measurement chip 122 to measure the charge remaining in the rechargeable battery 120. The power adapter 200 includes an input terminal 210, a voltage conversion unit 220, a microprocessor 240, a display unit 260, and a transmission line 280. The display unit 260 includes five light emitting diodes (LEDs) D1-D5. The transmission line 280 includes a positive power line 282, a negative power line 284, a data signal line 286, and a clock signal line 288. The voltage conversion unit 220 is connected to the input terminal 210, and connected to the rechargeable battery 120 via the positive power line 282 and the negative power line 284. The microprocessor 240 is connected to the LEDs D1-D5, and connected to the measurement chip 122 via the data signal line 286 and the clock signal line 288. In one embodiment, the portable device 100 may be a notebook computer, a mobile phone, a camera, a handheld game console, or a personal digital assistant. The data signal line 286 and the clock signal line 288 are a data signal line and a clock signal line of an inter-integrated circuit bus respectively. The measurement chip 122 powered by the rechargeable battery 120, may be mounted to the rechargeable battery 120 internally or externally.

The input terminal 210 is used to receive an external alternating current (AC) power supply, such as a 220 volt (V) AC power supply, and transmit the external AC power supply to the voltage conversion unit 220. The voltage conversion unit 220 transforms the external AC power supply to a direct current (DC) power supply, such as a 19V DC power supply needed by the portable device 100, and outputs the DC power supply to the rechargeable battery 120 via the positive power line 282 and the negative power line 284, to recharge the rechargeable battery 120, and to power the portable device 100. The microprocessor 240 receives a readout of the charge remaining in the rechargeable battery 120 from the measurement chip 122 via the data signal line 286 and the clock signal line 288, compares the charge remaining with the full charge capacity of the rechargeable battery 120 to obtain a charge ratio, and generates a display signal to control the display unit 260 to display charging progress of the rechargeable battery 120 according to the charge ratio.

The microprocessor 240 recognizes a predetermined number of charge states, and in this embodiment there are five states. When the charge ratio is in a range from about 0% to about 20%, the microprocessor 240 determines the charging progress is in a first state, and outputs a first display signal to turn on the LED D1. When the charge ratio is in a range from about 20% to about 40%, the microprocessor 240 determines the charging progress is in a second state, and outputs a second display signal to turn on the LEDs D1 and D2. When the charge ratio is in a range from about 40% to about 60%, the microprocessor 240 determines the charging progress is in a third state, and outputs a third display signal to turn on the LEDs D1-D3. When the charge ratio is in a range from about 60% to about 80%, the microprocessor 240 determines the charging progress is in a fourth state, and outputs a fourth display signal to turn on the LEDs D1-D4. When the charge ratio is in a range from about 80% to about 100%, the microprocessor 240 determines the charging progress is in a fifth state, and outputs a fifth display signal to turn on the LEDs D1-D5. In other embodiments, the number of the states recognized by the microprocessor 240 may be varied according to actual need, and the number of the LEDs may be varied correspondingly.

Figure 3:
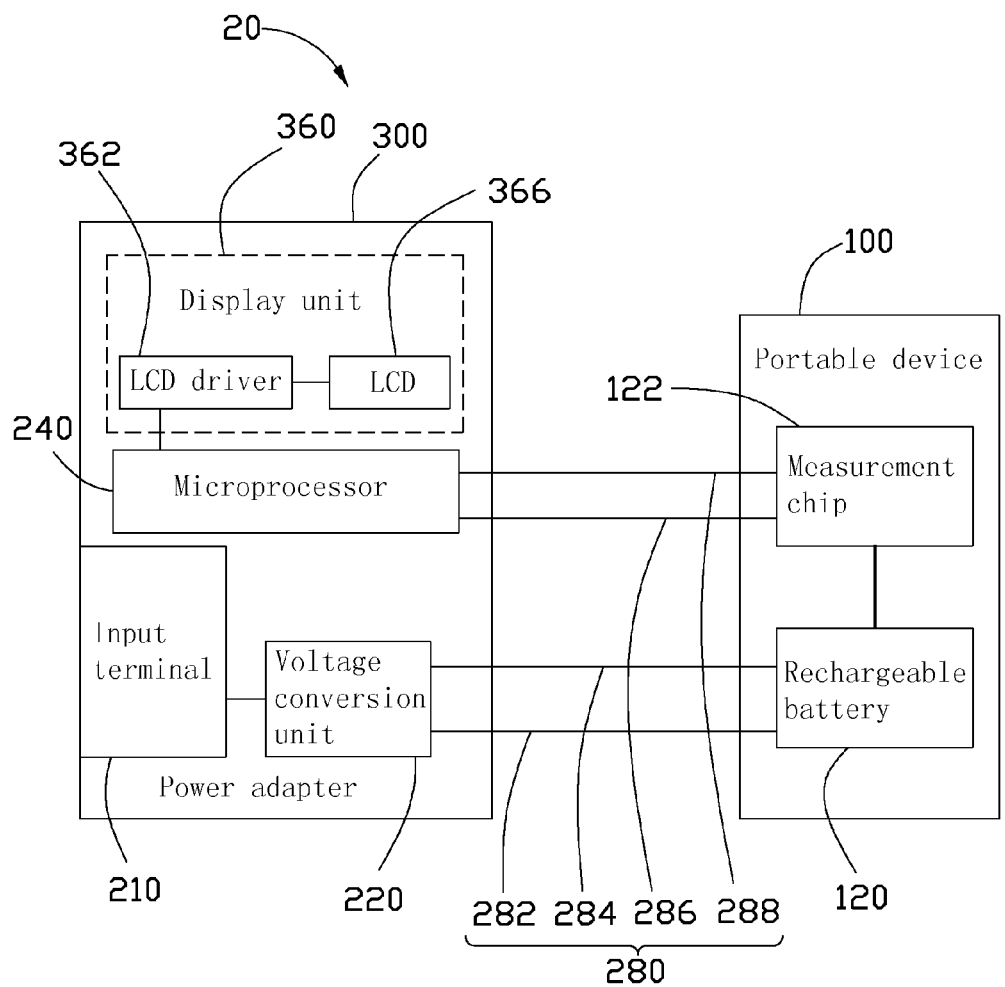
FIG. 3 is a block diagram of a second exemplary embodiment of a portable system.
Figure 4:
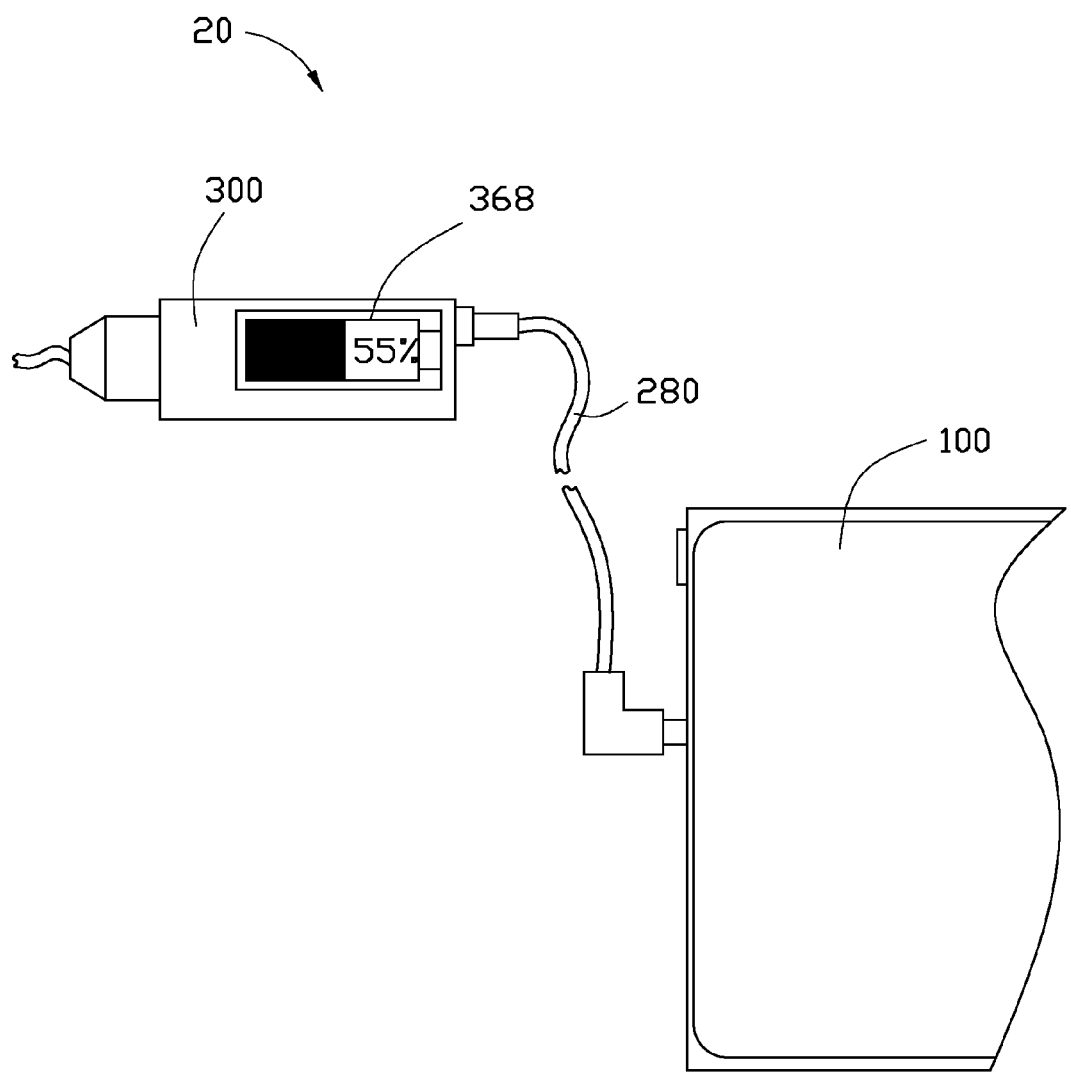
FIG. 4 is a schematic diagram of the portable system of FIG. 3.

Referring to FIGS. 3 and 4, a second exemplary embodiment of a portable system 20 is similar to the first embodiment of the portable system 10, except that a power adapter 300 of the portable system 20 includes a display unit 360, and the display unit 360 includes a liquid crystal display (LCD) driver 362 and an LCD 366. The LCD driver 362 is connected to the microprocessor 240 and the LCD 366, to receive the display signal from the microprocessor 240, and to drive the LCD 366 to display the charging progress of the rechargeable battery 120 according to the display signal. In this embodiment, the LCD 366 displays a battery image 368 and a percentage value corresponding to amount of charge indicated in the battery image 368. In other embodiments, the LCD 366 may display the charging progress of the rechargeable battery 120 by other images and data according to actual need.

As detailed above, according to assembling the data signal line 286 and the clock signal line 288 in the transmission line 280, the microprocessor 240 can receive the charge remaining in the rechargeable battery 120 from the measurement chip 122. Further, according to assembling the display unit on the power adapter, the charging progress of the rechargeable battery 120 can be known easily, even when the portable device 100 is not powered on.

The foregoing description of the exemplary embodiments of the disclosure has been presented only for the purposes of illustration and description and is not intended to be exhaustive or to limit the disclosure to the precise forms disclosed. Many modifications and variations are possible in light of the above everything. The embodiments were chosen and described in order to explain the principles of the disclosure and their practical application so as to enable others of ordinary skill in the art to utilize the disclosure and various embodiments and with various modifications as are suited to the particular use contemplated. Alternative embodiments will become apparent to those of ordinary skills in the art to which the present disclosure pertains without departing from its spirit and scope. Accordingly, the scope of the present disclosure is defined by the appended claims rather than the foregoing description and the exemplary embodiments described therein.

What is claimed is:

1. A portable system comprising:
   a portable device comprising a rechargeable battery and a measurement chip to measure charge remaining in the rechargeable battery; and
   a power adapter to supply power to the portable device, wherein the power adapter comprises:
      a transmission line comprising a data signal line and a clock signal line connected to the measurement chip;
      a microprocessor to receive a readout of the charge remaining in the rechargeable battery from the measurement chip via the data signal line and the clock signal line, and to generate a display signal according to the charge remaining; and
      a display unit to display charging progress of the rechargeable battery according to the display signal received from the microprocessor.

2. The portable system of claim 1, wherein the display unit comprises a liquid crystal display (LCD) driver and an LCD, the LCD driver is connected to the microprocessor to receive the display signal, and connected to the LCD to drive the LCD to display the charging progress of the rechargeable battery according to the display signal.

3. The portable system of claim 2, wherein the LCD displays a battery image and a percentage value corresponding to amount of charge indicated in the battery image.

4. The portable system of claim 1, wherein the display unit comprises a plurality of light emitting diodes (LEDs) connected to the microprocessor, the microprocessor outputs the display signal to turn on corresponding LEDs to display the charging progress of the rechargeable battery.

5. A power adapter for supplying power to a portable device, the power adapter comprising:
   a transmission line comprising a data signal line and a clock signal line connected to a measurement chip of the portable device, wherein the measurement chip measures charge remaining in a rechargeable battery of the portable device;
   a microprocessor to receive a readout of the charge remaining in the rechargeable battery from the measurement chip via the data signal line and the clock signal line, and to generate a display signal according to the charge remaining; and
   a display unit to display charging progress of the rechargeable battery according to the display signal received from the microprocessor.

6. The power adapter of claim 5, wherein the display unit comprises a liquid crystal display (LCD) driver and an LCD, the LCD driver is connected to the microprocessor to receive the display signal, and connected to the LCD to drive the LCD to display the charging progress of the rechargeable battery according to the display signal.

7. The power adapter of claim 6, wherein the LCD displays a battery image and a percentage value corresponding to amount of charge indicated in the battery image.

8. The power adapter of claim 5, wherein the display unit comprises a plurality of light emitting diodes (LEDs) connected to the microprocessor, the microprocessor outputs the display signal to turn on corresponding LEDs to display the charging progress of the rechargeable battery.

* * * * *